United States Patent [19]

Croup

[11] 4,122,911

[45] Oct. 31, 1978

[54] LOUDSPEAKER ASSEMBLY

[75] Inventor: Robert E. Croup, Indianapolis, Ind.

[73] Assignee: Acoustic Fiber Sound Systems, Inc., Indianapolis, Ind.

[21] Appl. No.: 701,974

[22] Filed: Jul. 1, 1976

[51] Int. Cl.[2] ........................ A47B 81/06; H05K 5/00

[52] U.S. Cl. .................................... 181/199; 179/1 E; 181/148; 181/154

[58] Field of Search ............... 181/199, 148, 154, 156; 179/1 E, 115.5 R

[56] References Cited

U.S. PATENT DOCUMENTS

| | | | |
|---|---|---|---|
| 2,890,297 | 6/1959 | Lehr | 181/148 |
| 3,578,103 | 5/1971 | Lennes | 181/156 |
| 3,804,195 | 4/1974 | Everitt et al. | 181/148 |
| 3,941,207 | 3/1976 | Croup | 181/199 |

*Primary Examiner*—Stephen J. Tomsky
*Attorney, Agent, or Firm*—Vogel, Dithmar, Stotland, Stratman & Levy

[57] ABSTRACT

A loudspeaker having a magnet housing and mounting flange is mounted within an enclosure including an inner member of corrugated fiberboard cut at angles to the corrugations thereof to define hingedly interconnected panels foldable to form a generally prismoidal housing with a speaker opening in one wall and with support panels extending from the bottom of the housing and recessed to receive the speaker magnet housing therein to support same. The walls of the corrugated housing are held in assembled configuration by interlocking tabs and slots and interlocking tongues and recesses, and the speaker mounting flange overlies the outer surface of the one wall and is trapped thereagainst by a face panel of corrugated fiberboard. An outer member of corrugated fiberboard with a decorative outer cover sheet thereon is folded around and adhesively secured to the corrugated housing, the inner and outer fiberboard members and the face panel cooperating to provide each wall of the enclosure with two layers of corrugated fiberboard having corrugations disposed at angles to each other. A perforated grille board is secured to the outer surface of the face panel. The margins of the outer corrugated member are pressed together with the cover sheet to form flattened edges to facilitate insertion of the bottom edges in a flanged baseplate and the top edges in a flanged trim frame encompassing the one wall, the trim frame having integral stakes extending through the grille board to facilitate attachment thereof.

15 Claims, 14 Drawing Figures

50 FIG. 1
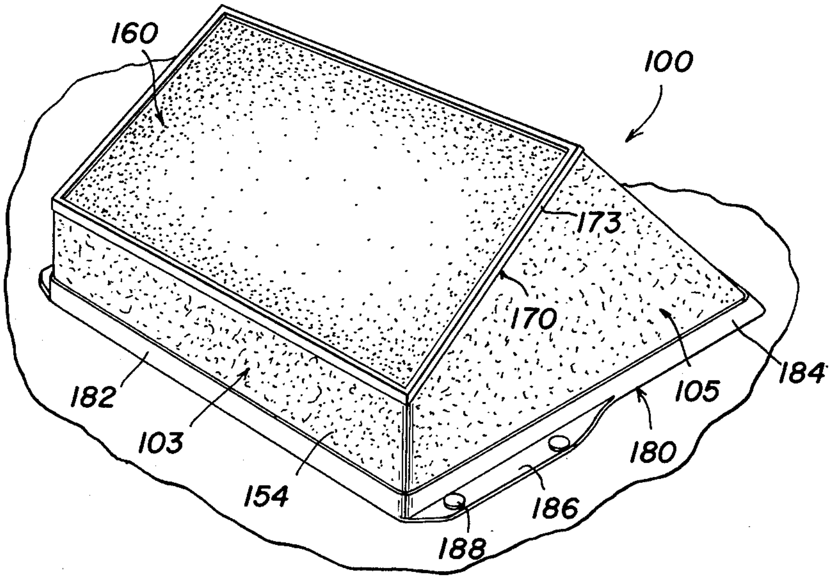
FIG. 12
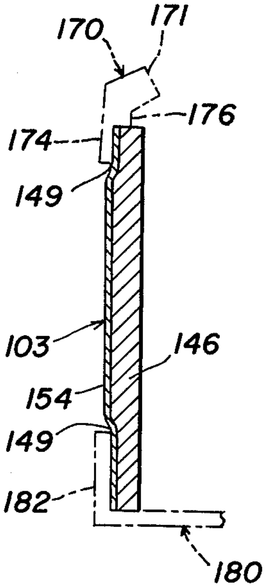
50
FIG. 2
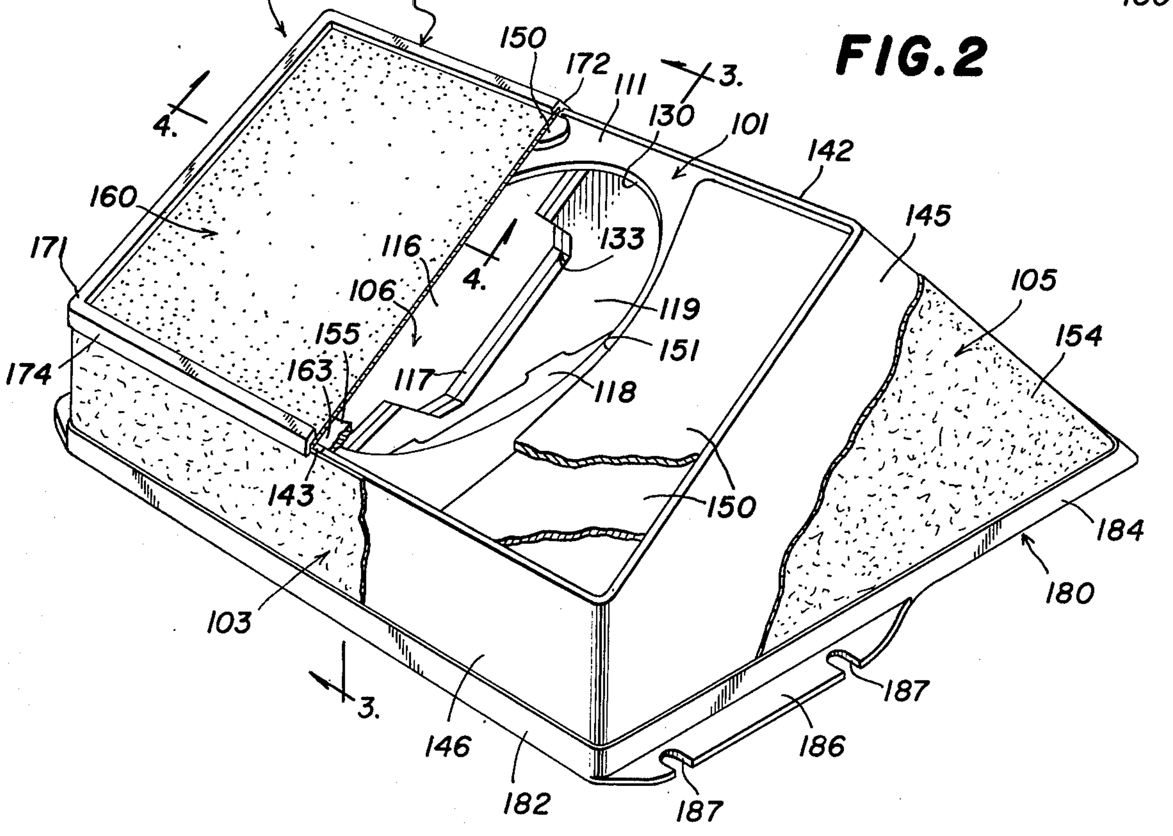

FIG. 7
FIG. 8
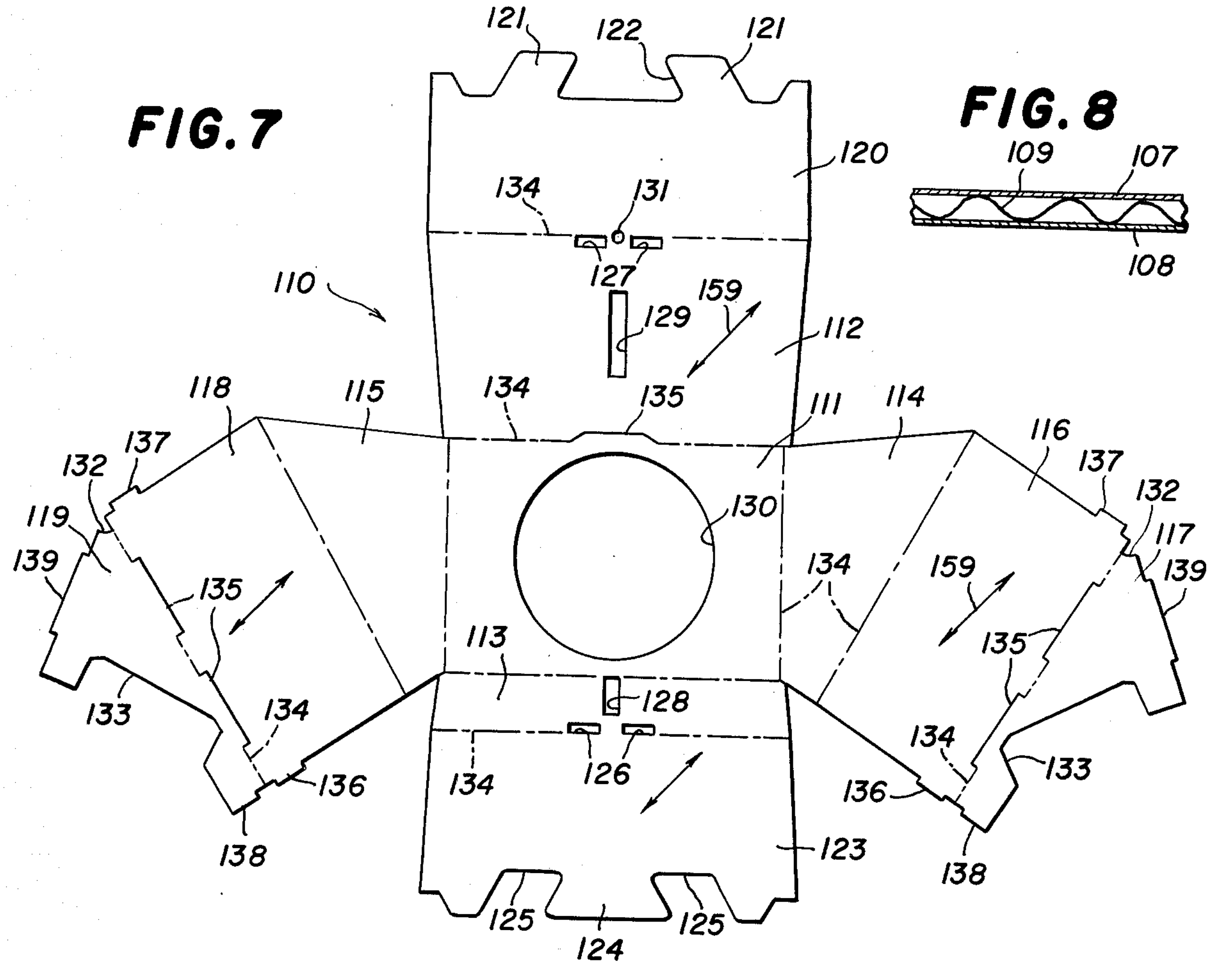
FIG. 9
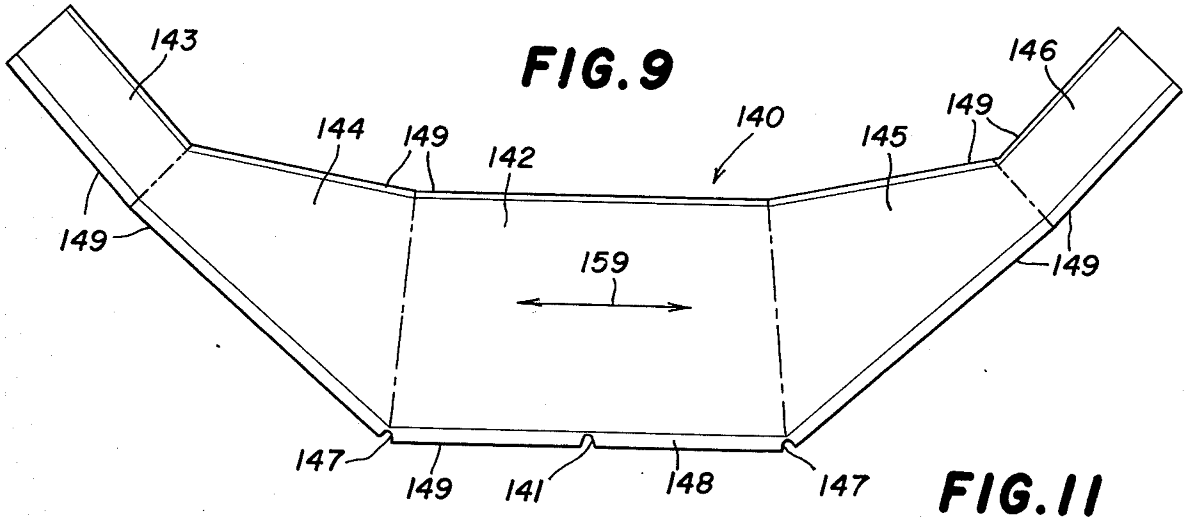
FIG. 10
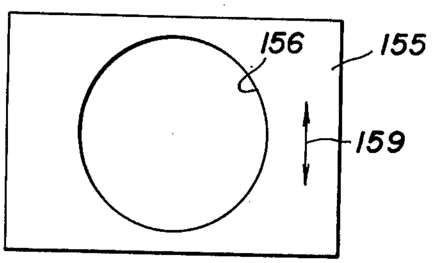
FIG. 11
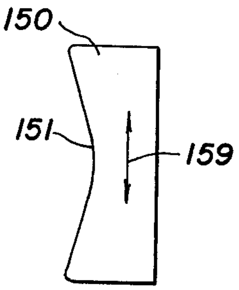

FIG. 13
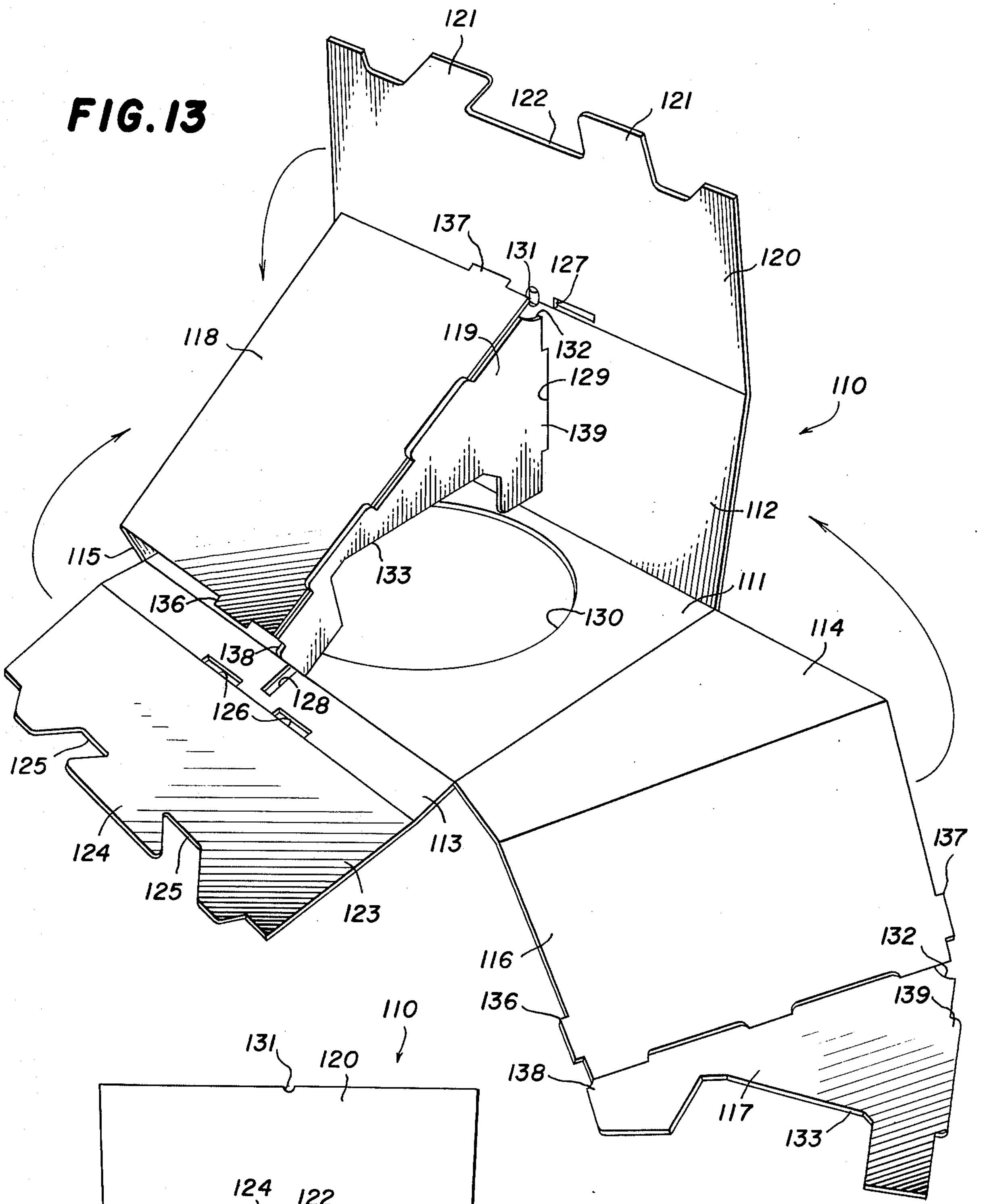
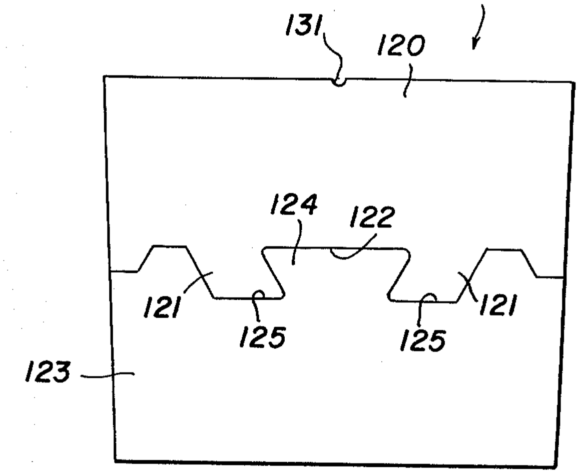
FIG. 14

LOUDSPEAKER ASSEMBLY

BACKGROUND OF THE INVENTION

The present invention relates generally to improvements in loudspeaker assemblies, and specifically to the provision of an assembly including a loudspeaker enclosure having at least two layers of corrugated material in each wall. Specifically, this invention relates to improvements in loudspeaker assemblies adapted to be fixedly mounted on a support surface, such as the rear package shelf of an automobile, a support wall or the like.

Prior loudspeaker assemblies having multi-layered walls of corrugated material are shown in U.S. Pat. No. 3,789,953 granted Feb. 5, 1974 to Scott F. Everitt and in my copending U.S. application Ser. No. 500,597, filed Aug. 26, 1974, entitled "LOUDSPEAKER ASSEMBLY", now U.S. Pat. No. 3,941,207, and assigned to the assignee of the present invention. While such loudspeaker assemblies have been highly effective in terms of providing good acoustical properties, and while the loudspeaker assembly of the aforementioned application has provided for a more convenient manufacture, neither has been readily susceptible to mass production methods of providing the cuts or perforations between the several panels of each corrugated member.

Furthermore, such prior loudspeaker assemblies have not been suitable for mounting in a moving vehicle such as an automobile which undergoes a considerable amount of vibration, bouncing, acceleration and deceleration, since the loudspeakers have been supported in the enclosures solely at the mounting flange, which arrangement provides undue stress on the mounting flange and on the corrugated fiberboard wall to which the flange is attached in an environment such as a moving vehicle. Furthermore, such prior art loudspeaker assemblies have not provided for ready mounting to a support surface.

SUMMARY OF THE INVENTION

The present invention provides a loudspeaker assembly wherein the inner layers of corrugated material for all the walls are provided as a single integral inner member having cuts therein to define hingedly interconnected panels, the cuts all being formed at acute angles to the direction of the corrugations to facilitate mass production of the inner member by die-cutting.

Another feature of the present invention is a combination of interlocking tabs and slots and interlocking tongues and recesses for holding the inner corrugated member in its assembled configuration.

Another feature of this invention is that the inner corrugated member includes corrugated panels disposed within the loudspeaker enclosure for providing a rest or support for the magnet housing of the loudspeaker, and which cooperates with the flange mounting of the loudspeaker to provide a secure and rigid support for the loudspeaker at both ends thereof.

These features are accomplished in the present invention, and it is an object of the present invention to accomplish these desired results by providing a loudspeaker assembly comprising a loudspeaker, an enclosure including a plurality of interconnected walls for accommodating the loudspeaker therein, each of the walls including at least two layers of corrugated material, one of the walls having an opening therein to facilitate the emission of sound waves from the enclosure, the inner layers of the walls being formed from a single integral inner corrugated member having corrugations extending in a predetermined direction, the inner corrugated member having a plurality of cuts partway through the thickness thereof and extending in directions at acute angles to the predetermined direction respectively to form hinges, the hinges dividing the inner corrugated member into a plurality of interconnected panels foldable respectively to form the inner layers of the walls, and means holding the panels assembled with respect to each other and about the loudspeaker.

It is another object of this invention to provide a loudspeaker assembly which includes support means carried within the enclosure and disposed for engagement with the magnet housing of the loudspeaker to support the loudspeaker in the enclosure.

In connection with the foregoing object, it is another object of this invention to provide a loudspeaker assembly of the type set forth, wherein the support means and the inner layers of the walls are all formed from a single integral inner corrugated member.

It is another object of this invention to provide a loudspeaker assembly of the type set forth, wherein the loudspeaker has a mounting flange and is supported with that flange trapped between the outer surface of the one wall and a face panel for securely mounting the flange around the periphery of the opening in the one wall.

Further features of the invention pertain to the particular arrangement of the parts of the loudspeaker assembly whereby the above-outlined and additional operating features thereof are attained.

The invention, both as to its organization and method of operation, together with further objects and advantages thereof, will best be understood by reference to the following specification taken in connection with the accompanying drawings.

BRIEF DESCRIPTION OF THE DRAWINGS

FIG. 1 is a front perspective view of a loudspeaker assembly constructed in accordance with and embodying the features of the present invention;

FIG. 2 is an enlarged front perspective view of the loudspeaker assembly of FIG. 1, with portions of the assembly broken away more clearly to show the internal construction of the assembly, but with the loudspeaker removed;

FIG. 7 is a bottom plan view of the inner corrugated member of the loudspeaker assembly of the present invention, with the inner corrugated member laid out flat;

FIG. 8 is an enlarged fragmentary cross sectional view of the corrugated material used in the loudspeaker assembly of the present invention;

FIG. 9 is a plan view of the inner surface of the outer corrugated member of the present invention, with the outer corrugated member laid flat;

FIG. 10 is a plan view of the corrugated face sheet of the present invention;

FIG. 11 is a plan view of one of the corrugated spacer members of the present invention;

FIG. 12 is an enlarged fragmentary view in vertical section of an outer layer of the front wall of the present invention, showing the cooperation between the flattened edges thereof and the baseplate and trim frame;

FIG. 13 is a bottom rear perspective view of the inner corrugated member of the present invention, shown in a partially assembled configuration; and FIG. 14 is a bottom plan view of the inner corrugated member of the present invention in the assembled configuration thereof.

DESCRIPTION OF THE PREFERRED EMBODIMENT

Figures 3, 4, 5, 6:
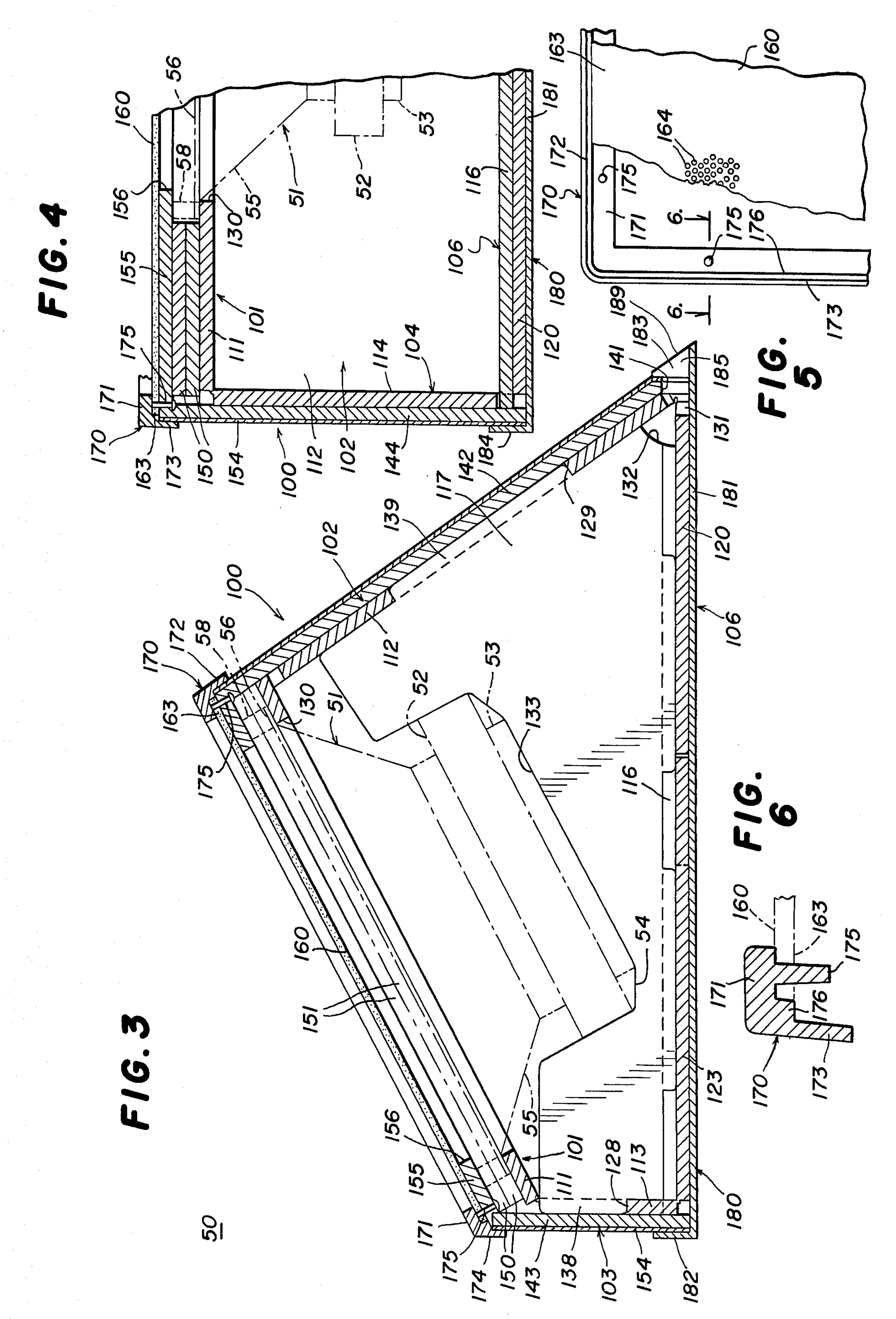
FIG. 3 is a further enlarged view in vertical section taken along the line 3—3 in FIG. 2, and with the loudspeaker illustrated in phantom.
FIG. 4 is a fragmentary cross sectional view taken along the line 4—4 in FIG. 2.
FIG. 5 is a fragmentary bottom plan view of the grille board and trim frame of the loudspeaker assembly of the present invention, with portions of the grille board broken away.
FIG. 6 is an enlarged cross sectional view of the trim frame taken along the line 6—6 in FIG. 5, and illustrating the cooperation thereof with the grille board.

Referring now to FIGS. 1 through 4 of the drawings, there is illustrated a loudspeaker assembly, generally designated by the numeral 50, including a loudspeaker 51 supported within an enclosure 100. The loudspeaker 51 includes a magnet 52 carried by a generally cylindrical support or housing 53. Coupled to the magnet housing 53 at the front thereof is a frustoconical speaker cone 55 provided at the outer edge thereof with an annular radially outwardly extending attachment flange 56. Fixedly secured to the attachment flange 56 and extending therearound are spaced-apart spacer members 58.

The enclosure 100 is generally prismoidal in shape, and includes a sloping top front wall 101, a sloping top rear wall 102, a front wall 103, a pair of opposed side walls 104 and 105 and a bottom wall 106. The enclosure 100 varies from a true prismoidal shape in that no two of the walls 101 through 106 are parallel to each other, the side walls 104 and 105 converging upwardly at a slight angle.

Referring now also to FIGS. 7 through 9 of the drawings, the enclosure 100 includes an inner corrugated member 110 and an outer corrugated member 140, the members 110 and 140 being arranged in folded configurations to form the walls 101 through 106, with each of the walls 102 through 106 having two layers of corrugations. Each of the corrugated members 110 and 140 is preferably formed of corrugated fiberboard, which includes a pair of flat planar parallel liner sheets 107 and 108, spaced apart by and adhesively secured to a fluted or corrugated sheet 109 (see FIG. 8).

The inner corrugated member 110 includes a generally rectangular top front panel 111 which has respectively hingedly connected to the top and bottom edges thereof a top rear panel 112 and a front panel 113, and has respectively hingedly connected to the opposite side edges thereof two side panels 114 and 115. Respectively hingedly connected to the side panels 114 and 115 at the outer edges thereof are inner bottom panel sections 116 and 118, to the outer side edges of which are in turn respectively hingedly connected two speaker support panels 117 and 119. Hingedly connected to the top rear panel 112 is an outer bottom panel section 120 provided along the distal edge thereof with two tongues 121 separated by a generally keystone-shaped recess or notch 122. Hingedly connected to the front panel 113 is an outer bottom panel section 123 provided with a generally keystone-shaped tongue 124 flanked by a pair of recesses or notches 125, the tongue 124 and recesses 125 being respectively shaped and arranged for mating and interlocking engagement with the recess 122 and tongues 121, as will be described more fully hereinafter.

Formed in the front panel 113 at the hinge connection with the outer bottom panel section 123 are two laterally spaced-apart and aligned rectangular slots 126, extending generally horizontally in use, while a similar pair of slots 127 is formed in the top rear panel 112 at the hinge connection with the outer bottom panel section 120. Formed in the front panel section 113 between the horizontal slots 126 and at the hinge connection with the top front panel 111 is a slot 128, which extends substantially vertically in use, while a similar but longer slot 129 is formed centrally of the top rear panel 112. Formed centrally in the top front panel 111 is a large circular speaker opening 130. A small circular conductor hole 131 is formed at the hinge connection between the top rear panel 112 and the outer bottom panel section 120 between the slots 127, with one-half of the conductor hole 131 being formed in the top rear panel 112, and the other half thereof being formed in the outer bottom panel secton 120. The rear corners of the speaker support panels 117 and 119 are each provided with arcuate cutouts or recesses 132 therein adjacent to the hinge connections with the inner bottom panel sections 116 and 118. Recesses 133 are formed in the end edges of the speaker support panels 117 and 119 and are shaped snugly to receive therein the bottom of the loudspeaker magnet housing 53.

Low knife cuts are formed along the broken lines 134 to form the hinge connections between the panels 111 through 120 and 123. The low knife cuts 134 extend through the outer one of the liner sheets 107 of the corrugated material and through the corrugated sheet 109 thereof, but do not go through the other liner sheet 108, that uncut liner sheet providing the hinge connections between the panels. However, full cuts entirely through the corrugated material are made at the lines 135 at the hinge connections of the inner bottom panel sections 116 and 118 with the speaker support panels 117 and 119, and at the hinge connection of the top front panel 111 with the top rear panel 112, the full cuts 135 being generally U-shaped and joining at the ends thereof adjacent low knife cuts 134 so as to provide projections extending outwardly from the periphery of the top front panel 111 and the speaker support panels 117 and 119. Respectively formed along the front and rear edges of the inner bottom panel sections 116 and 118 and projecting therefrom are front bottom tabs 136 and rear bottom tabs 137. Similarly, respectively formed along the front and rear edges of the speaker support panels 117 and 119 and projecting therefrom are front support tabs 138 and rear support tabs 139.

The outer corrugated member 140 includes a generally trapezoidal top rear panel 142 having centrally disposed along the bottom edge thereof a conductor cutout or recess 141. Hingedly connected to the top rear panel 142 at one side edge thereof is a side panel 144 having hingedly connected thereto at the distal end thereof a generally rectangular front panel section 143. Hingedly connected to the top rear panel 142 at the other side edge thereof is a side panel 145 having hingedly connected thereto at the distal end thereof another front panel section 146. Small arcuate cutouts or recesses 147 are respectively formed along the botton edge of the outer corrugated member 140 at the hinge connections between the top rear panel 142 and the side panels 144 and 145. The hinge connections between the panels 142 through 146 are formed by scoring the inner surface of the corrugated material to compress it and facilitate folding thereof. Also, the top rear panel 142 is scored along a line parallel to the bottom edge thereof and spaced a slight distance therefrom to form a bottom flap 148, for a purpose to be described more fully below.

The outer surface of the outer corrugated member 140 is covered by a decorative outer sheet 154 (see FIGS. 2 through 4 and 12), which may be formed of a synthetic organic resin such as polyvinyl chloride resin, and which is adhesively secured to the outer surface of the outer corrugated member 140. It is a significant feature of the present invention that along the peripheral margins of the outer corrugated member 140, the corrugated material and the decorative outer sheet 154 are compressed together to form flattened edges, as at 149 (FIG. 9), for a purpose to be described more fully below.

Referring now also to FIGS. 13 and 14 of the drawings, in assembling the enclosure 100, the inner corrugated member 110 is first folded into the assembled configuration thereof. The side panels 114 and 116 are first folded up, as indicated by the arrows in FIG. 13, and the inner bottom panel sections 116 and 118 are then folded in toward each other until they are substantially coplanar, the speaker support panels 117 and 119 being folded inwardly toward the top front panel 111 until they are disposed in back to back engagement with each other and substantially at right angles to the inner bottom panel sections 116 and 118. The top rear panel 112 is then folded up, with the tabs 139 on the speaker support panels 117 and 119 being received in the slot 129. The outer bottom panel section 120 is then folded down over the inner bottom panel sections 116 and 118, with the tabs 137 being respectively received in the slots 127. In like manner, the front panel 113 is folded up, with the tabs 138 of the speaker support panels 117 and 119 being received in the slot 128. The outer bottom panel section 123 is then folded up over the inner bottom panel sections 116 and 118, with the tabs 136 being respectively received in the slots 126.

It will be noted that the speaker support panels 117 and 119 cooperate to form a support structure for the loudspeaker 51, the engagement of the tabs 138 and 139 respectively in the slots 128 and 129 serving to rigidly hold the speaker support panels 117 and 119 in position, it being appreciated that the slot 128 is wide enough to receive both of the tabs 138 and the slot 129 is wide enough to receive both of the tabs 139. The inner bottom panel sections 116 and 118 cooperate to form an inner bottom panel, while the outer bottom panel sections 120 and 123 cooperate to form an outer bottom panel, the inner and outer bottom panels providing the two layers of corrugated material for the bottom wall 106 of the enclosure 100. It will also be understood that the tongues 121 and 124 of the outer bottom panel sections 120 and 123 are respectively received in meshing engagement with the recesses 125 and 122 to provide a dovetailed interlocking arrangement for securely holding the outer bottom panel sections 120 and 123 together, and for holding the inner corrugated member 110 in the assembled configuration thereof.

Additionally, it will be appreciated that the engagement of the tabs 136, 137, 138 and 139, respectively, in the slots 126, 127, 128 and 129 provides a further interlocking arrangement for holding the inner corrugated member 110 in its assembled configuration. When thus assembled, the inner corrugated member 110 will be resting on the top front panel 11 thereof and, when viewed from above, will appear as in FIG. 14.

Next, the inner corrugated member 110 is inverted and set upon the enclosure bottom wall 106 and the outer corrugated member 140 is wrapped therearound, with the inner surfaces of the panels 142, 144 and 145 being respectively disposed in engagement with the outer surfaces of the panels 112, 114 and 115, and with the front panel sections 143 and 146 disposed in coplanar abutting end-to-end relationship with respect to each other, with the inner surfaces thereof respectively disposed against the outer surface of the front panel 113. Preferably, the outer corrugated member 140 is adhesively secured to the inner corrugated member 110, with the bottom edge of the outer corrugated member 140 disposed substantially flush with the outer surface of the outer bottom panel sections 120 and 123 of the inner corrugated member 110. The height of the panels 142 through 146 of the outer corrugated member 140 are such that they extend a predetermined distance upwardly and forwardly of the top front panel 111 of the inner corrugated member 110, whereby the latter panel is recessed with respect to the outer corrugated member 140.

The loudspeaker 51 may now be inserted in the enclosure 100 through the speaker opening 130 in the top front panel 111. The magnet housing 152 is received in the speaker recesses 133 in the speaker support panels 117 and 119 and rests thereon, with the attachment flange 56 being disposed against the front surface of the top front panel 111 in surrounding relationship with the speaker opening 130. The conductors from the magnet housing 52 are passed through the conductor hole 131 at the back of the enclosure 100 at the juncture between the bottom wall 106 and the top rear panel 102, this passage of the conductors being facilitated by the recesses 132 at the rear ends of the speaker support panels 117 and 119, and by the recess 141 in the outer corrugated member 140. Preferably, the attachment flange 56 of the loudspeaker 51 is adhesively secured to the top front panel 111.

The loudspeaker assembly 50 also includes a plurality of spacer members 150 (see FIG. 11), preferably formed of corrugated fiberboard, the spacer members being respectively disposed against the outer surface of the top front panel 111 at opposite sides of the loudspeaker attachment flange 56, the spacer members having concave side edges as at 151 to conform to the contour of the loudspeaker attachment flange 56 and being dimensioned substantially to occupy the space between the attachment flange 56 and the side panels 144 and 145 of the outer corrugated member 140. A number of the spacer members 150 are stacked at each side of the attachment flange 56 to a depth sufficient to bring the outer surfaces of the top ones of the spacer members 150 into a plane substantially flush with the tops of the loudspeaker spacers 58, the spacer members 150 preferably being adhesively secured together, with the bottom ones thereof being adhesively secured to the top front panel 111 of the inner corrugated member 110.

The loudspeaker assembly 50 also includes a rectangular face panel 155 (see FIG. 10) having a circular speaker aperture 156 therethrough centrally thereof, and preferably being formed of corrugated fiberboard. The face panel 155 is dimensioned to be received over the loudspeaker mounting flange 56 and the spacer members 150 and to fit snugly within the recess formed by the panels of the outer corrugated member 140 so that the outer surface of the face panel 155 is substantially flush with the top edges of the outer corrugated member 140. The speaker aperture 156 is dimensioned and positioned so as to be substantially congruent with the speaker opening 130, and the face panel 155 is adhesively secured to the spacer members 150 for cooperation therewith and with the top front panel 111 of the inner corrugated member 110 firmly to trap the loudspeaker mounting flange 56 therebetween effectively to prevent movement of the loudspeaker 51 within the enclosure 100.

It is a significant feature of the present invention that the loudspeaker 51 is mounted in place in the enclosure 100 by a combined mounting arrangement including both the trapping of the mounting flange 56 by the top front panel 111 and the face panel 155 and the spacer members 150, as well as the support of the loudspeaker magnet housing 53 by the loudspeaker support panels 117 and 119, whereby the loudspeaker 51 is effectively rendered immovable with respect to the enclosure 100. This arrangement provides a separate support for the loudspeaker magnet housing 53, which is the heaviest part of the loudspeaker 51 along both the rear and side surfaces thereof. Without this additional support for the magnet housing 53, the loudspeaker 51 would be supported solely by the attachment between the mounting flange 56 and the top front panel 111, in cantilever fashion, as in the prior art loudspeaker assemblies referred to above. Such a cantilever mounting of the loudspeaker 51 might result in undue strain on the mounting flange 56 and/or the top front panel 111 when the loudspeaker assembly 50 is subject to forces such as those experienced when the loudspeaker assembly is mounted in a moving vehicle. Thus, the unique mounting arrangement of the present invention renders the loudspeaker assembly 50 particularly adaptable to use in vehicles, such as automobiles and the like.

The corrugations in each of the corrugated members 110, 140, 150 and 155 extend in the directions indicated by the arrows 159 in FIGS. 7 and 9 through 11. It will be noted that each of the low knife cuts 134 and full cuts 135 in the inner corrugated member 110 are along lines disposed at an acute angle substantially greater than zero degrees to the direction of the corrugations. It has been found that making the cuts at angles to the corrugations greatly facilitates the use of die-cutting techniques in fabricating the inner corrugated member 110, thereby facilitating mass production thereof.

Furthermore, it will be noted that when the corrugated members 110, 140, 150 and 155 are cut with the direction of the corrugations disposed as indicated by the arrows 159, the several panels of the corrugated members will be foldable to an assembled configuration wherein each of the walls 101 through 106 of the enclosure 100 has two layers of corrugations, with the corrugations of the inner layer of each wall being crossed with or at an angle to the corrugations of the outer layer of that wall. This crossed-corrugation arrangement serves to effect cancellation of those undesirable sound waves generated within the enclosure 100, which are not radiated outwardly through the speaker openings 130 and 156 by the speaker diaphragm 55, thereby having a sound-deadening or suppressing effect on the undesirable sound waves generated by the rear surface of the speaker diaphragm 55.

Overlying the face panel 155 is a grille board 160 which is provided with a plurality of perforations 164 therethrough (see FIG. 5), and which is preferably integrally formed from a single piece of plastic material as by molding, and is then covered by a fabric grille cloth (not shown), adhesively secured to the outer surface of the grille board 160. Extending outwardly from the grille board 160 around the entire periphery thereof is a mounting flange 163, which may be adhesively secured to the outer surface of the face panel 155, the grille board 160 being dimensioned to completely cover the face panel 155.

A trim frame 170, preferably molded of plastic, extends around the entire perimeter of the grille board and has a front wall 171 which overlies the mounting flange 163 of the grille board 160 and the upper edges of the outer corrugated member 140. Integral with the front wall 171 and extending downwardly therefrom at the outer edge thereof are a top flange 172, side flanges 173 and a bottom flange 174, the flanges 172 through 174 being disposed at angles with respect to the front wall 171 such that they respectively lie along the outer surfaces of the panels 142, 144, 145 and the panel formed by the panel sections 143 and 146 of the outer corrugated member 140, substantially parallel thereto. The trim frame 170 is dimensioned so as to fit snugly around the top margins of the outer corrugated member 140, the flattened edges 149 thereof serving to facilitate reception thereof within the trim frame 170 (see FIG. 12).

Formed on the inner surface of the trim frame 170 at spaced-apart points therealong are positioning lugs 176 against which the mounting flange 163 of the grille board 160 abuts to center the grille board 160 with respect to the trim frame 170 (see FIG. 6). Also formed integrally with the front wall 171 of the trim frame 170 and extending downwardly therefrom at spaced-apart points therealong are a plurality of stakes 175 which, in use, are driven through the mounting flange 163 of the grille board 160. The distal ends of the stakes 75 may then be melted as with a hot iron or the like to flatten the ends into beads or heads so that the stakes 75 function like rivets fixedly to secure the grille board 160 to the trim frame 170. Preferably, the trim frame 170 is also adhesively secured to the outer corrugated member 140 and the grille board mounting flange 163, securely to hold the trim frame 170 in place.

The loudspeaker assembly 50 is also provided with a baseplate 180 (see FIGS. 1–4 and 12), which is preferably a solid molded plastic piece and includes a substantially trapezoidal flat bottom wall 181 substantially congruent with the bottom wall 106 of the enclosure 100. Integral with the bottom wall 181 and extending a short distance upwardly therefrom are a front wall 182, a rear wall 183 and a pair of opposed side walls 184. The rear wall 183 is provided with a slot 185 extending therethrough substantially midway between the ends thereof. Respectively extending laterally outwardly from the side walls 184 adjacent to the front wall 182 are two mounting flanges 186, each being provided with two slots 187 therein for receiving fasteners 188 such as screws, bolts or the like.

The housing 100, with the loudspeaker 51 mounted therein, is received snugly within the baseplate 180, with the rear wall 102 of the enclosure 100 disposed against the rear wall 103 of the baseplate 180. It will be noted that the inner surface of the rear wall 183 of the baseplate 180 is disposed substantially perpendicular to the bottom wall 181 thereof, while the outer surface of the rear wall 183 is disposed at an angle so as to be substantially coplanar with the top rear wall 102 of the enclosure 100 to present the appearance of a continuous unbroken outer surface. However, the flap 148 at the bottom of the top rear panel 142 of the outer corrugated member 140 is foldable to lie flush against the inner surface of the rear wall 183 of the baseplate 180 so as to firmly and snugly accommodate the enclosure 100 within the baseplate 180, without disturbing the clean external appearance of the loudspeaker assembly 50. The sloping top rear wall 102 of the enclosure 100 facilitates mounting of the loudspeaker assembly on the rear package shelf of an automobile by accommodating the sloping rear window of the automobile. Preferably, the bottom wall 106 of the enclosure 100 is adhesively secured to the baseplate 180 to complete the loudspeaker assembly 50, the rear slot 185 of the baseplate 180 being disposed in alignment with the recess 141 of the outer corrugated member 140 to permit passage of the loudspeaker conductor leads from the enclosure 100.

While the corrugated members 110, 140, 150 and 155 have been illustrated as being formed from corrugated fiberboard or paperboard for simplicity and economy of fabrication, it will be appreciated that other corrugated materials may be used to produce the same sound-deadening effect, as long as the adjacent layers of corrugated material have the corrugations thereof crossed with respect to each other in substantially all of the walls of the enclosure 100. Also, while only one loudspeaker and one opening have been shown in the loudspeaker assembly 50, it will be appreciated that any desired number of loudspeakers and corresponding openings may be provided.

Furthermore, it will be understood that reflex ports and other openings may be used, depending upon the acoustical requirements of a given system. Likewise, other decorative sheets 154 may be provided in place of the polyvinyl chloride resin sheet illustrated. Thus, it is anticipated that such materials as patterned paper or vinyl resins, either supported or non-supported, wood veneers, metal, other plastics either flexible or rigid, cloths, nonwoven materials, leather, furs, foams, stone veneers, various woven or metal fabrics and materials, cork, glass or painted or sprayed materials may be used to form the decorative sheet 154 to suit the needs and desires of individual customers.

Furthermore, it will be understood that any desired type of material may be used to form the grille board 160, the trim frame 170 and the baseplate 180.

From the foregoing, it can be seen that there has been provided a novel and improved loudspeaker assembly which affords simplicity and economy of mass production, while preserving high acoustical quality.

In addition, there has been provided a loudspeaker assembly which provides support for both the mounting flange and the magnet housing of the loudspeaker so as to provide a loudspeaker assembly which is suitable for mounting in moving vehicles, without placing undue stress on the loudspeaker or the loudspeaker enclosure.

There has also been provided an improved loudspeaker assembly of the character described, which affords a unique arrangement of folded and interlocked panels of corrugated material.

There has also been provided an improved loudspeaker assembly having a base frame and a front trim frame, the outer margins of the loudspeaker enclosure being compressed and flattened to facilitate assembly thereof with the base frame and trim frame.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A loudspeaker assembly comprising a loudspeaker having a magnet means, an enclosure including a plurality of interconnected walls for accommodating said loudspeaker therein, one of said walls having an opening therein to facilitate the emission of sound waves from said enclosure, and support means carried within said enclosure and having rear and side supporting surfaces respectively disposed for supporting engagement with said magnet means along the rear and sides thereof to support said loudspeaker in said enclosure.

2. The loudspeaker assembly set forth in claim 1, wherein said enclosure and said support means are formed of corrugated material.

3. The loudspeaker assembly set forth in claim 1, wherein said enclosure and said support means are formed of corrugated material and are integral with each other.

4. The loudspeaker assembly set forth in claim 1, wherein said support means is disposed for supporting said loudspeaker in a position substantially coaxial with said opening.

5. The loudspeaker assembly set forth in claim 1, wherein said one wall is a flat planar wall, said support means including a panel disposed in a plane substantially perpendicular to the plane of said one wall, the edge of said panel facing said one wall having a recess therein for receiving the magnet means of said loudspeaker.

6. A loudspeaker assembly comprising a loudspeaker having a magnet housing and a diaphragm, an enclosure including a plurality of interconnected walls for accommodating said loudspeaker therein, each of said walls including at least two layers of corrugated material, one of said walls having an opening therein to facilitate the emission of sound waves from said enclosure, support means carried within said enclosure and having rear and side supporting surfaces respectively disposed for engagement with said magnet housing to support said loudspeaker in said enclosure, said support means and the inner layers of said walls all being formed from a single integral inner corrugated member having corrugations extending in a predetermined direction, said inner corrugated member having a plurality of panels hingedly interconnected along hinge lines extending in directions at acute angles to said predetermined direction, each of said hinge lines comprising a cut extending only partway through the thickness of said inner corrugated member, and means holding said panels assembled with respect to each other and about said loudspeaker.

7. The loudspeaker assembly set forth in claim 6, wherein said inner corrugated member includes a top front panel and a front panel and a top rear panel and two opposed side panels hingedly connected to said top front panel and four bottom panel sections respectively hingedly connected to said side panels and to said top rear panel and to said front panel, two of said bottom panel sections cooperating to provide an inner bottom panel and the other two of said bottom panel sections cooperating to provide an outer bottom panel, one of said outer bottom panel sections having a tongue thereon and the other outer bottom panel section having a notch therein cooperating with the associated tongue to provide a dovetail interconnection for holding said outer bottom panel sections together to form said outer bottom panel.

8. The loudspeaker assembly set forth in claim 6, wherein said inner corrugated member includes a top front panel and a front panel and a top rear panel and two opposed side panels hingedly connected to said top front panel and four bottom panel sections respectively hingedly connected to said side panels and to said top rear panel and to said front panel, two of said bottom panel sections cooperating to provide an inner bottom panel and the other two of said bottom panel sections cooperating to provide an outer bottom panel, said inner bottom panel sections having laterally extending tabs thereon and said panels carrying said outer bottom panel sections having slots therein receiving said tabs to hold said bottom panel sections in assembled relationship with the other panels.

9. The loudspeaker assembly set forth in claim 6, wherein said means holding said panels assembled with respect to each other includes adhesive means.

10. A loudspeaker assembly comprising a loudspeaker including a magnet means and a front mounting flange, an enclosure including a plurality of interconnected walls for accommodating said loudspeaker therein, one of said walls having an opening therein to facilitate the emission of sound waves from said enclosure, support means carried within said enclosure and having rear and side supporting surfaces respectively disposed for supporting engagement with said magnet means along the rear and sides thereof to support said loudspeaker in said enclosure with said front mounting flange being disposed in engagement with the outer surface of said one wall around the periphery of said opening, and a face panel fixedly mounted on the outer surface of said one wall and cooperating therewith firmly to trap said front mounting flange therebetween fixedly to position said loudspeaker with respect to said opening, said face panel having an aperture therein substantially congruent with said opening in said one wall to facilitate emission of sound waves from said enclosure, said support means cooperating with said one wall and said face panel to support said loudspeaker effectively to prevent movement thereof with respect to said enclosure.

11. The loudspeaker assembly set forth in claim 10, wherein said enclosure and said support means and said face panel are all formed of corrugated material.

12. The loudspeaker assembly set forth in claim 10, wherein said enclosure and said support means and said face panel are all formed of corrugated material, said enclosure and said support means being formed integrally with each other.

13. The loudspeaker assembly set forth in claim 10, and further including spacer means fixedly secured to the outer surface of said one wall adjacent to and of substantially the same thickness as said loudspeaker front mounting flange, said face panel being fixedly secured to said spacer means and cooperating therewith and with said one wall to trap said mounting flange therebetween.

14. The loudspeaker assembly set forth in claim 10, wherein said one wall is recessed with respect to the adjacent walls connected thereto a distance sufficient to accommodate said loudspeaker front mounting flange and said face panel.

15. A loudspeaker assembly comprising a loudspeaker having a magnet housing and a diaphragm, an enclosure including a plurality of interconnected walls for accommodating said loudspeaker therein, each of said walls including at least two layers of corrugated material, one of said walls having an opening therein to facilitate the emission of sound waves from said enclosure, support means carried within said enclosure and disposed for engagement with said magnet housing to support said loudspeaker in said enclosure, said support means and the inner layers of said walls all being formed from a single inner corrugated member having corrugations extending in a predetermined direction, said inner corrugated member having a plurality of panels hingedly interconnected along hinge lines, each of said hinge lines comprising a cut extending only partway through the thickness of said inner corrugated member, said support means including two panels of said inner corrugated member disposed in use in congruent back-to-back relationship, said support means extending in use from the bottom of said enclosure toward said one wall and having a recess therein for receiving the magnet housing of said loudspeaker, and means holding said panels assembled with respect to each other and about said loudspeaker.

* * * * *